(12) United States Patent
Yanagidaira

(10) Patent No.: US 8,816,723 B1
(45) Date of Patent: Aug. 26, 2014

(54) BUFFER CIRCUIT

(71) Applicant: Kabushiki Kaisha Toshiba, Minato-ku (JP)

(72) Inventor: Kosuke Yanagidaira, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/959,984

(22) Filed: Aug. 6, 2013

Related U.S. Application Data

(60) Provisional application No. 61/770,671, filed on Feb. 28, 2013.

(51) Int. Cl.
*H03K 5/22* (2006.01)

(52) U.S. Cl.
USPC .......................................................... 327/77

(58) Field of Classification Search
USPC .................. 327/77, 78, 80, 81, 85, 88, 89
See application file for complete search history.

(56) References Cited

U.S. PATENT DOCUMENTS

| | | | |
|---|---|---|---|
| 6,081,133 A | 6/2000 | Hedberg | |
| 6,137,314 A * | 10/2000 | Buck | 326/83 |
| 6,327,190 B1 | 12/2001 | Kim et al. | |
| 6,472,907 B2 | 10/2002 | Setogawa | |
| 7,759,981 B2 | 7/2010 | Ha | |
| 7,821,304 B2 * | 10/2010 | Kim et al. | 327/108 |
| 7,956,650 B2 | 6/2011 | Choi | |
| 7,965,105 B2 | 6/2011 | Dimitriu | |
| 8,476,937 B2 * | 7/2013 | Em | 327/77 |

FOREIGN PATENT DOCUMENTS

| | | |
|---|---|---|
| JP | 2000-503173 | 3/2000 |
| JP | 2000-306385 | 11/2000 |
| JP | 2002-171164 | 6/2002 |
| JP | 2008-48407 | 2/2008 |

* cited by examiner

*Primary Examiner* — Jeffrey Zweizig
(74) *Attorney, Agent, or Firm* — Oblon, Spivak, McClelland, Maier & Neustadt, L.L.P.

(57) ABSTRACT

A buffer circuit includes a first current mirror circuit, a second current mirror circuit, a first transistor, and a second transistor. The first current mirror circuit passes a first mirror current through a second node, corresponding to a first current passed through a first node, and is activated based on a first activating signal. The second current mirror circuit is connected to the first node and the second node, passes a second mirror current through the second node, corresponding to a second current passed through the first node, and is activated based on a second activating signal. The first transistor has a gate to which a reference voltage is applied and has a drain connected to the first node. The second transistor has a gate to which an input voltage is applied and has a drain connected to the second node.

20 Claims, 3 Drawing Sheets

BUFFER CIRCUIT

CROSS REFERENCE TO RELATED APPLICATIONS

This application is based on and claims the benefit of priority from prior U.S. provisional Patent Application 61/770,671, filed on Feb. 28, 2013, the entire contents of which are incorporated herein by reference.

FIELD

Embodiments relate to a buffer circuit.

BACKGROUND

Description of the Related Art

When signal transmission between semiconductor devices is performed at high speed by DDR (Double Data Rate) interface, misalignment of rise time and fall time of signals (skew) is a problem. For example, an input buffer circuit is required to fulfill a role of increasing amplitude of an input signal while keeping skew small.

At the same time, in recent years, NAND flash memory is configured to support a plurality of different I/O power supply voltages in an identical chip. To comply with this NAND flash memory, a configuration that provides a plurality of input buffer circuits in order to make skew small and handle the plurality of I/O power supply voltages, is considered. However, if a plurality of input buffer circuits are provided, circuit area of these input buffer circuits increases.

DETAILED DESCRIPTION

A buffer circuit according to an embodiment described below includes a first current mirror circuit, a second current mirror circuit, a first transistor, and a second transistor. The first current mirror circuit passes a first mirror current through a second node, corresponding to a first current passed through a first node, and is activated based on a first activating signal. The second current mirror circuit is connected to the first node and the second node, passes a second mirror current through the second node, corresponding to a second current passed through the first node, and is activated based on a second activating signal. The first transistor has a gate to which a reference voltage is applied and has a drain connected to the first node. The second transistor has a gate to which an input voltage is applied and has a drain connected to the second node.

First Embodiment

Figure 1:
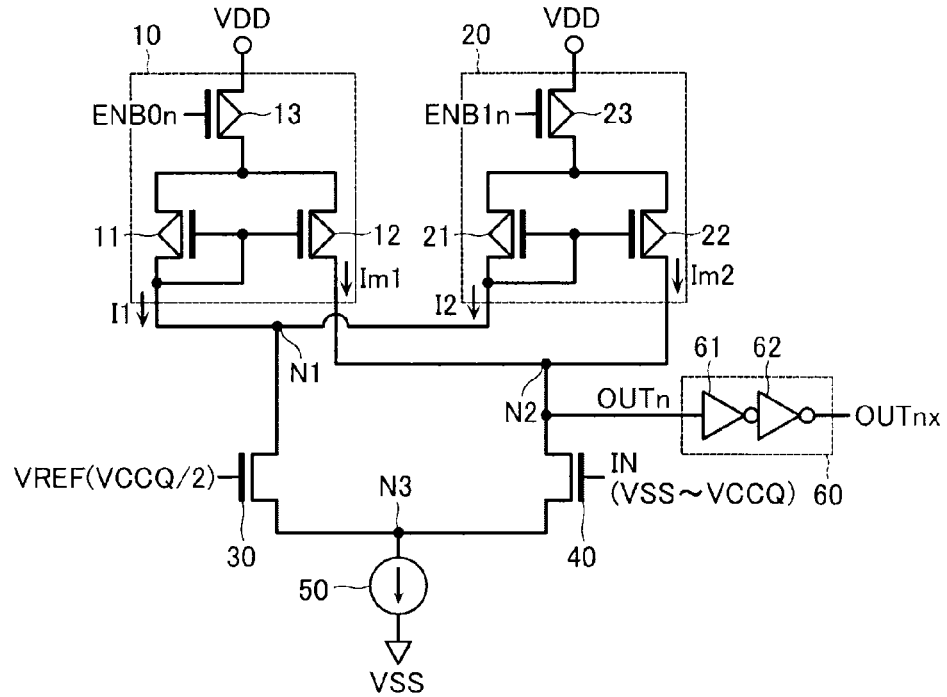
FIG. 1 is a circuit diagram of an input buffer circuit according to a first embodiment.

FIG. 1 is a circuit diagram of an input buffer circuit according to a first embodiment. As shown in FIG. 1, the input buffer circuit according to the first embodiment outputs an output voltage OUTnx based on an input voltage IN. If the input voltage IN is higher than a reference voltage VREF, the input buffer circuit outputs a "Low level" output voltage OUTnx. On the other hand, if the input voltage IN is lower than the reference voltage VREF, the input buffer circuit outputs a "High level" output voltage OUTnx. As shown in FIG. 1, the input buffer circuit includes: current mirror circuits 10 and 20 connected between a power supply terminal (first power supply terminal) VDD and a first node N1 and second node N2; NMOS transistors 30 and 40 and a constant current source 50 connected between the first node N1 and second node N2 and a ground terminal (second power supply terminal) VSS; and an output buffer circuit 60 having a drain of the NMOS transistor 40 as an input terminal.

The current mirror circuit 10 passes a mirror current Im1 through the node N2, corresponding to a current I1 passed through the node N1, the mirror current Im1 being equal to the current I1. Moreover, the current mirror circuit 10 is activated based on an activating signal ENB0$n$. The current mirror circuit 20 is connected to the nodes N1 and N2. The current mirror circuit 20 passes a mirror current Im2 through the node N2, corresponding to a current I2 passed through the node N1, the mirror current Im2 being equal to the current I2. Moreover, the current mirror circuit 20 is activated based on an activating signal ENB1$n$.

The NMOS transistor 30 is connected between the node N1 and a node N3, and has its gate to which the reference voltage VREF is inputted to determine a voltage of the node N1 based on the reference voltage VREF. Now, the reference voltage VREF is set to substantially half (½) of an amplitude (VCCQ) of the input voltage IN. The NMOS transistor 40 is connected between the node N2 and the node N3, and has its gate to which the input voltage IN is inputted to control a voltage of the node N2 based on the input voltage IN.

The constant current source 50 is connected between the node N3 and the ground terminal VSS. The output buffer circuit 60 has its input terminal connected to the node N2 and is configured by inverters 61 and 62 connected in series.

Next, a specific configuration of the current mirror circuits 10 and 20 is described. As shown in FIG. 1, the current mirror circuit 10 includes PMOS transistors 11~13. The PMOS transistors 11 and 12 are current-mirror-connected to each other. The PMOS transistor 11 has its drain connected to the node N1, and the PMOS transistor 12 has its drain connected to the node N2. The PMOS transistor 13 is connected between the power supply terminal VDD and sources of the PMOS transistors 11 and 12. The PMOS transistor 13 has its gate applied with the activating signal ENB0$n$.

As shown in FIG. 1, the current mirror circuit 20 includes PMOS transistors 21~23. The PMOS transistors 21 and 22 are current-mirror-connected to each other. The PMOS transistor 21 has its drain connected to the node N1, and the PMOS transistor 22 has its drain connected to the node N2. The PMOS transistor 23 is connected between the power supply terminal VDD and sources of the PMOS transistors 21 and 22. The PMOS transistor 23 has its gate applied with the activating signal ENB1$n$.

Figure 2:
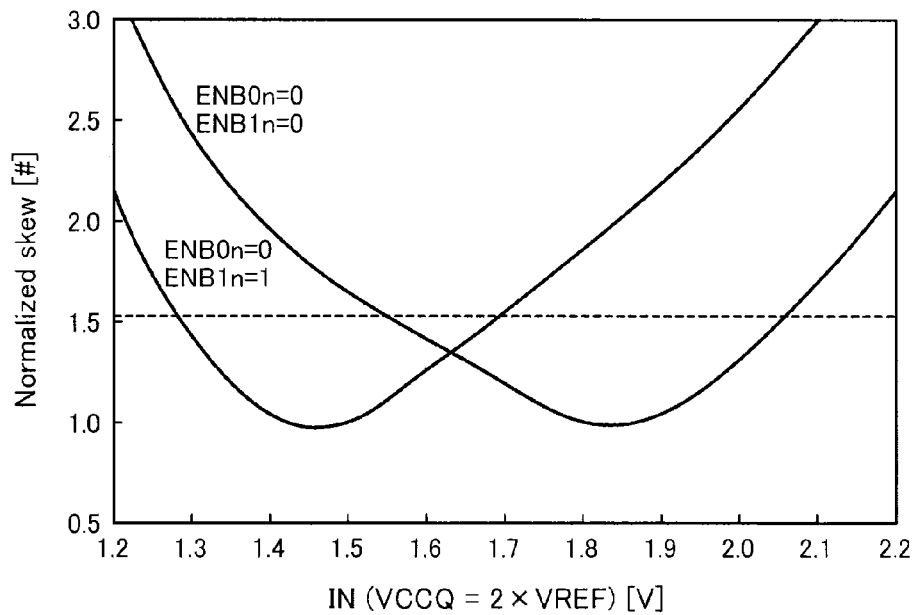
FIG. 2 is a view showing skew along with an input voltage IN according to the first embodiment.

FIG. 2 shows change in skew along with the input voltage IN. Skew means misalignment of rise time and fall time of signals. Now, if a setting of ENB0$n$=0 and ENB1$n$=1 is made, then only the current mirror circuit 10 is in an activated state, the current mirror circuit 20 being in an inactivated state. Therefore, only the current mirror circuit 10 passes a current through the nodes N1 and N2. In this case, as shown in FIG. 2, skew has a minimum value in a vicinity of IN=1.45 V.

On the other hand, if a setting of ENB0$n$=0 and ENB1$n$=0 is made, then the current mirror circuits 10 and 20 are both in an activated state. Therefore, the current mirror circuits 10 and 20 both pass a current through the nodes N1 and N2. In this case, as shown in FIG. 2, skew has a minimum value in a vicinity of IN=1.84 V.

As described above, the present embodiment makes it possible to change the input voltage IN at which skew becomes a minimum, according to the activating signals ENB0$n$ and ENB1$n$. Therefore, in the present embodiment, selecting whether to set the activating signals ENB0$n$ and ENB1$n$ to 0 and 1, or 0 and 0, based on the amplitude of the input voltage IN makes it possible to perform a setting resulting in minimum skew, based on the amplitude of the input voltage IN. Therefore, skew can be reduced handling a broad range of the input voltage IN, without providing a plurality of input buffer circuits. Accordingly, the present embodiment allows increase in circuit area to be suppressed.

Second Embodiment

Figure 3:
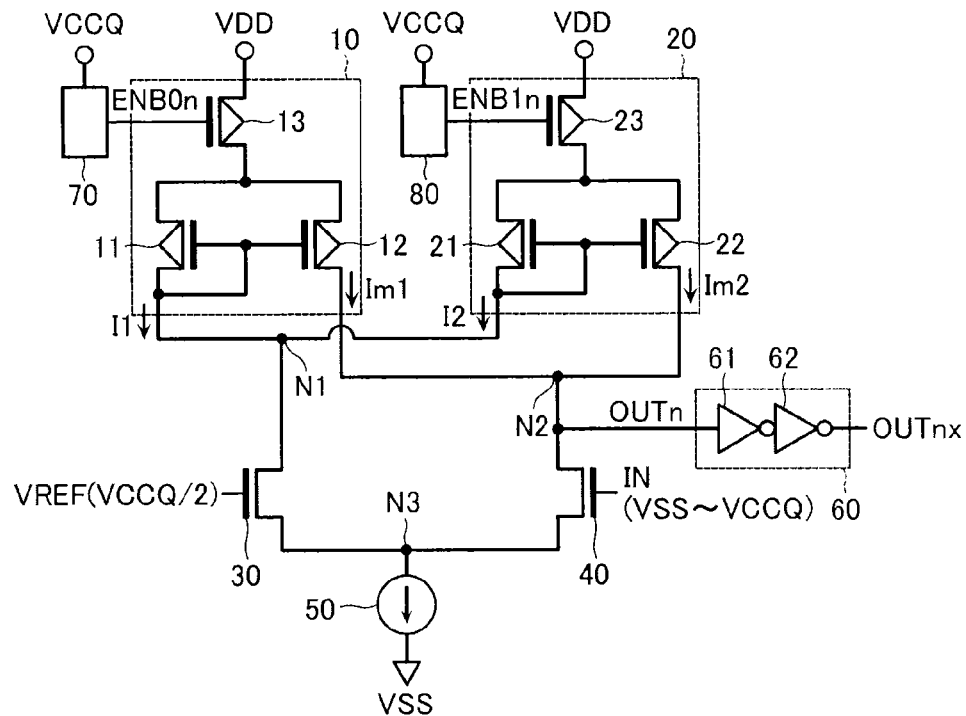
FIG. 3 is a circuit diagram of an input buffer circuit according to a second embodiment.

Next, an input buffer circuit according to a second embodiment is described with reference to FIG. 3. As shown in FIG. 3, the input buffer circuit according to the second embodiment includes activating signal generating circuits 70 and 80, in addition to configurations 10~60 similar to those of the first embodiment. When the amplitude of the input voltage IN is a first threshold value or more, the activating signal generating circuit 70 generates the activating signal ENB0$n$ for activating the current mirror circuit 10. When the amplitude of the input voltage IN is a second threshold value or more (larger than the first threshold value), the activating signal generating circuit 80 generates the activating signal ENB1$n$ for activating the current mirror circuit 20.

Figure 4:
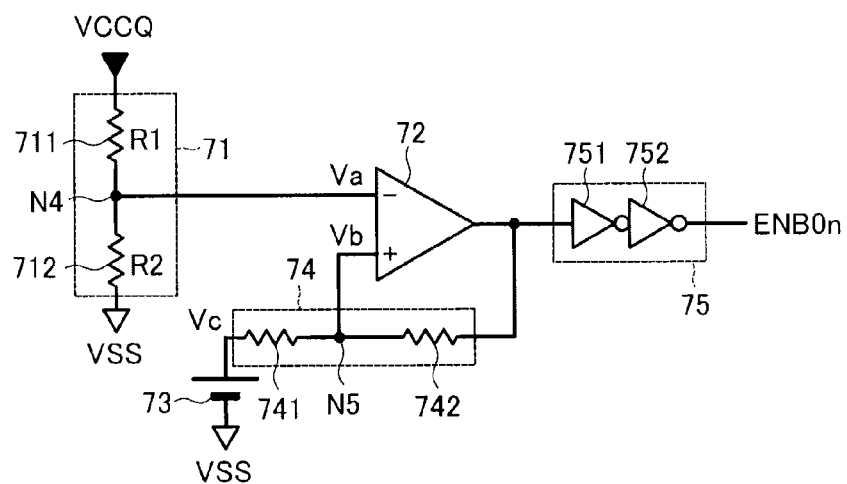
FIG. 4 is a circuit diagram showing an activating signal generating circuit 70 according to the second embodiment.

Next, a configuration of the activating signal generating circuit 70 is described with reference to FIG. 4. The activating signal generating circuit 70 includes a voltage-dividing circuit 71, a comparator 72, a constant voltage source 73, a voltage-dividing circuit 74, and an output buffer circuit 75.

The voltage-dividing circuit 71 voltage-divides an I/O power supply voltage VCCQ determining the amplitude of the input voltage IN, to generate a voltage-divided voltage Va. The voltage-dividing circuit 71 is configured by resistances 711 and 712 connected in series. The resistance 711 has its one end to which the I/O power supply voltage VCCQ is applied, and the resistance 712 has its one end connected to the ground terminal VSS. A node N4 between the resistances 711 and 712 is connected to an inverting input terminal of the comparator 72. A ratio of a resistance value R1 of the resistance 711 and a resistance value R2 of the resistance 712 is assumed to be (R1/R2)=(11/89).

The comparator 72 compares the voltage-divided voltage Va and a voltage-divided voltage Vb, to output the activating signal ENB0$n$. The constant voltage source 73 supplies a constant voltage Vc, and is connected between the voltage-dividing circuit 74 and the ground terminal VSS. The constant voltage source 73 is configured by, for example, a band gap reference circuit, and supplies approximately 1.2 V.

The voltage-dividing circuit 74 voltage-divides the constant voltage Vc to generate the voltage-divided voltage Vb. The voltage-dividing circuit 74 is configured by resistances 741 and 742 connected in series. The resistance 741 has its one end connected to the constant voltage source 73, and the resistance 742 has its one end connected to an output terminal of the comparator 72. A node N5 between the resistances 741 and 742 is connected to a non-inverting input terminal of the comparator 72.

The output buffer circuit 75 has its input terminal connected to the output terminal of the comparator 72. The output buffer circuit 75 is configured from inverters 751 and 752 connected in series.

Figure 5:
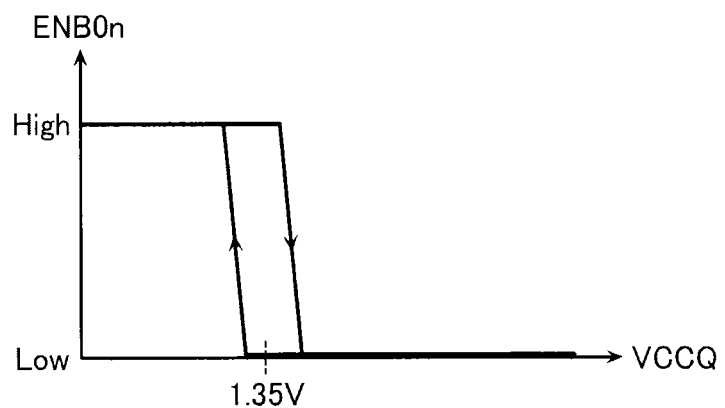
FIG. 5 is a view showing operation of the activating signal generating circuit 70 according to the second embodiment.

Next, operation of the activating signal generating circuit 70 is described with reference to FIG. 5. As shown in FIG. 5, the activating signal ENB0$n$ with respect to the I/O power supply voltage VCCQ describes a hysteresis curve. Note that hysteresis characteristics may also be eliminated by making a resistance value of the resistance 741 extremely small and a resistance value of the resistance 742 extremely large. If the I/O power supply voltage VCCQ is less than 1.35 V (first threshold value), the activating signal generating circuit 70 outputs a "High level" activating signal ENB0$n$. On the other hand, if the I/O power supply voltage VCCQ is 1.35 V or more, the activating signal generating circuit 70 outputs a "Low level" activating signal ENB0$n$.

Next, a configuration of the activating signal generating circuit 80 is described. The activating signal generating circuit 80 has a similar configuration to the activating signal generating circuit 70. However, in the activating signal generating circuit 80, the ratio of the resistance value R1 of the resistance 711 and the resistance value R2 of the resistance 712 is assumed to be (R1/R2)=(27/73). This ratio of resistance values causes the activating signal to be switched from a "High level" to a "Low level" at a higher I/O power supply voltage VCCQ than in the activating signal generating circuit 70.

Figure 6:
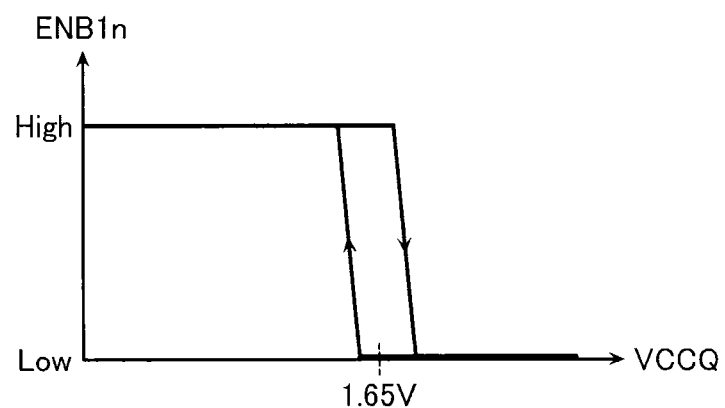
FIG. 6 is a view showing operation of an activating signal generating circuit 80 according to the second embodiment.

Next, operation of the activating signal generating circuit 80 is described with reference to FIG. 6. As shown in FIG. 6, the activating signal ENB1$n$ with respect to the I/O power supply voltage VCCQ describes a hysteresis curve. Note that hysteresis characteristics may also be eliminated by making a resistance value of the resistance 741 extremely small and a resistance value of the resistance 742 extremely large. If the I/O power supply voltage VCCQ is less than 1.65 V (second threshold value), the activating signal generating circuit 80 outputs a "High level" activating signal ENB1$n$. On the other hand, if the I/O power supply voltage VCCQ is 1.65 V or more, the activating signal generating circuit 80 outputs a "Low level" activating signal ENB1$n$.

As is clear from the above, the second embodiment displays similar advantages to those of the first embodiment. Furthermore, the second embodiment allows the current mirror circuits 10 and 20 to be activated according to the I/O power supply voltage VCCQ, by the activating signal generating circuits 70 and 80.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A buffer circuit comprising:
a first current mirror circuit configured to pass a first mirror current through a second node, corresponding to a first current passed through a first node, the first current mirror circuit being activated based on a first activating signal;

a second current mirror circuit connected to the first node and the second node and configured to pass a second mirror current through the second node, corresponding to a second current passed through the first node, the second current mirror circuit being activated based on a second activating signal;

a first transistor having a gate to which a reference voltage is applied and having a drain connected to the first node; and a second transistor having a gate to which an input voltage is applied and having a drain connected to the second node.

2. The buffer circuit according to claim 1, wherein the first current mirror circuit comprises:

a third transistor and a fourth transistor that are current-mirror-connected to each other, a drain of the third transistor being connected to the first node, and a drain of the fourth transistor being connected to the second node; and a fifth transistor connected between sources of the third transistor and the fourth transistor and a power supply terminal, and the first activating signal is applied to a gate of the fifth transistor.

3. The buffer circuit according to claim 2, wherein the first transistor and the second transistor are each NMOS transistors, and the third transistor, the fourth transistor, and the fifth transistor are each PMOS transistors.

4. The buffer circuit according to claim 1, wherein the second current mirror circuit comprises:

a sixth transistor and a seventh transistor that are current-mirror-connected to each other, a drain of the sixth transistor being connected to the first node, and a drain of the seventh transistor being connected to the second node; and an eighth transistor connected between sources of the sixth transistor and the seventh transistor and a power supply terminal, and the second activating signal is applied to a gate of the eighth transistor.

5. The buffer circuit according to claim 4, wherein the first transistor and the second transistor are each NMOS transistors, and the sixth transistor, the seventh transistor, and the eighth transistor are each PMOS transistors.

6. The buffer circuit according to claim 1, further comprising a first output buffer circuit having an input terminal connected to the second node, wherein the first output buffer circuit is configured from an inverter.

7. The buffer circuit according to claim 1, wherein the reference voltage is set to substantially half (½) of an I/O power supply voltage.

8. The buffer circuit according to claim 1, further comprising:

a first activating signal generating circuit configured to, when an I/O power supply voltage is a first threshold value or more, generate the first activating signal for activating the first current mirror circuit; and a second activating signal generating circuit configured to, when the I/O power supply voltage is a second threshold value or more, generate the second activating signal for activating the second current mirror circuit, wherein the second threshold value is larger than the first threshold value.

9. The buffer circuit according to claim 8, wherein the first activating signal generating circuit comprises:

a first voltage-dividing circuit for voltage-dividing an I/O power supply voltage to generate a first voltage-divided voltage;

a first comparator for comparing the first voltage-divided voltage and a second voltage-divided voltage, to output the first activating signal; and a constant voltage source for supplying a constant voltage.

10. The buffer circuit according to claim 9, wherein the first activating signal generating circuit further comprises a second output buffer circuit provided to an output terminal of the first comparator, and the second output buffer circuit is configured from an inverter.

11. The buffer circuit according to claim 9, wherein the constant voltage source is a band gap reference circuit.

12. The buffer circuit according to claim 8, wherein the second activating signal generating circuit comprises:

a second voltage-dividing circuit for voltage-dividing an I/O power supply voltage to generate a third voltage-divided voltage;

a second comparator for comparing the third voltage-divided voltage and a fourth voltage-divided voltage, to output the second activating signal; and a constant voltage source for supplying a constant voltage.

13. The buffer circuit according to claim 12, wherein the second activating signal generating circuit further comprises a third output buffer circuit provided to an output terminal of the second comparator, and the third output buffer circuit is configured from an inverter.

14. The buffer circuit according to claim 12, wherein the constant voltage source is a band gap reference circuit.

15. A buffer circuit comprising:

a first current mirror circuit connected between a first power supply terminal and a first node and a second node and configured to pass a first current through the first node and to pass a first mirror current corresponding to the first current through the second node, the first current mirror circuit being activated based on a first activating signal;

a second current mirror circuit connected between the first power supply terminal and the first node and the second node and configured to pass a second current through the first node and to pass a second mirror current corresponding to the second current through the second node, the second current mirror circuit being activated based on a second activating signal;

a first drive circuit to which a reference voltage is applied and having one end connected to the first node;

a second drive circuit to which an input voltage is applied and having one end connected to the second node; and a constant current circuit connected between other ends of the first drive circuit and the second drive circuit and a second power supply terminal.

16. The buffer circuit according to claim 15, further comprising:

a first activating signal generating circuit configured to, when an I/O power supply voltage is a first threshold value or more, generate the first activating signal for activating the first current mirror circuit; and a second activating signal generating circuit configured to, when the I/O power supply voltage is a second threshold value or more, generate the second activating signal for activating the second current mirror circuit, wherein the second threshold value is larger than the first threshold value.

17. The buffer circuit according to claim 16, wherein the first activating signal generating circuit comprises:

a first voltage-dividing circuit for voltage-dividing an I/O power supply voltage to generate a first voltage-divided voltage;

a first comparator for comparing the first voltage-divided voltage and a second voltage-divided voltage, to output the first activating signal; and a constant voltage source for supplying a constant voltage.

18. The buffer circuit according to claim 17, wherein the first activating signal generating circuit further comprises a first output buffer circuit provided to an output terminal of the first comparator, and the first output buffer circuit is configured from an inverter.

19. The buffer circuit according to claim 17, wherein the constant voltage source is a band gap reference circuit.

20. A buffer circuit comprising:

a first transistor having a gate to which a reference voltage is applied and having a drain connected to a first node, the reference voltage corresponding to half (½) of an I/O power supply voltage;

a second transistor having a gate to which the input voltage is applied and having a drain connected to a second node;

a first current mirror circuit comprising: a third transistor connected between a first power supply terminal and the first node; a fourth transistor connected between the first power supply terminal and the second node, the third transistor and the fourth transistor being current-mirror-connected to each other; and a fifth transistor provided between the first power supply terminal and sources of the third and fourth transistors, the fifth transistor being activated based on a first activating signal;

a second current mirror circuit comprising: a sixth transistor connected between the first power supply terminal and the first node; a seventh transistor connected between the first power supply terminal and the second node, the sixth transistor and the seventh transistor being current-mirror-connected to each other; and an eighth transistor provided between the first power supply terminal and sources of the sixth and seventh transistors, the eighth transistor being activated based on a second activating signal; and a constant current circuit connected between sources of the first transistor and the second transistor and a second power supply terminal.

* * * * *